United States Patent [15] 3,702,443

Okumura [45] Nov. 7, 1972

[54] AUDIO-FREQUENCY SIGNAL LEVEL CONTROL CIRCUIT

[72] Inventor: Takatoshi Okumura, Hamamatsu, Japan

[73] Assignee: Nippon Gakki Seizo Kabushiki, Kaisha, Hamamatsu-shi, Japan

[22] Filed: Jan. 27, 1971

[21] Appl. No.: 110,041

[52] U.S. Cl. ........................330/28, 330/29, 330/35, 330/95

[51] Int. Cl. ..............................................H03g 3/30

[58] Field of Search...............330/28, 29, 35, 95, 145

[56] References Cited

UNITED STATES PATENTS 3,452,290 6/1969 Huntley .................330/145 X

OTHER PUBLICATIONS

Elliot, " Field Effect Transistor as a Linear Variable Resistance," IBM Technical Disclosure Bulletin, Vol. 7, No. 1, June 1964, p. 111

*Primary Examiner*—Roy Lake
*Assistant Examiner*—James B. Mullins
*Attorney*—Cushman, Darby & Cushman

[57] ABSTRACT

In an audio signal level control circuit for use in an audio system such as an electronic musical instrument, which comprises an emitter-grounded type transistor amplifier, an input signal being applied to the base and an output signal being taken out from the collector, a constant-current supply circuit including another transistor and being connected in series in the emitter path of the amplifier, and a field effect transistor (FET) connected between the emitter of the amplifier and the ground from an AC viewpoint as a variable resistance element whose resistance value is controlled by a level control voltage applied to the gate of the FET; the improvement comprises a unidirectional amplifying circuit such as an emitter follower type transistor amplifier, the base of which being connected to the non-grounded side of the FET and the emitter being connected to the gate of the FET to provide a negative feedback function of the FET operation, thereby reducing the distortion in the output signal of the first-mentioned amplifier and eliminating the generation of noises due to rough variation of the control voltage.

5 Claims, 3 Drawing Figures

Takatoshi Okumura
INVENTOR

BY

Cushman, Darby & Cushman
ATTORNEYS

AUDIO-FREQUENCY SIGNAL LEVEL CONTROL CIRCUIT

BACKGROUND OF THE INVENTION a. Field of the Invention

The present invention is concerned with an audio-frequency signal level control circuit, and more particularly, it relates to an improvement in an audio-frequency signal level control circuit for use in an audio system such as an electronic musical instrument, which includes an audio amplifier, a voltage-controlled variable impedance element such as an FET controlling the level of the output of the amplifier, and a unidirectional amplifying circuit for performing a negative feedback function of the FET to improve the linearity of the FET without transmitting the noise from the control voltage to the first mentioned amplifier.

b. Summary of the Invention

It is an object of the present invention to provide an audio-frequency signal level control circuit of a voltage-controlled type, which is capable of not only greatly reducing the distortion in the output signal of the circuit but also capable of not introducing any noise due to the voltage control into the output signal.

Another object of the present invention is to provide an audio-frequency signal level control circuit of the previously stated type which is satisfactorily usable for an electronic musical instrument.

A further object of the present invention is tor provide an improved audio-frequency signal level control circuit which is simple in construction and easy to manufacture and is not expensive.

Other objects, features and advantages of the present invention will become apparent from the following detailed description when taken in conjunction with the accompanying drawings.

DISCRIPTION OF THE PREFERRED EMBODIMENTS

Figure 1:
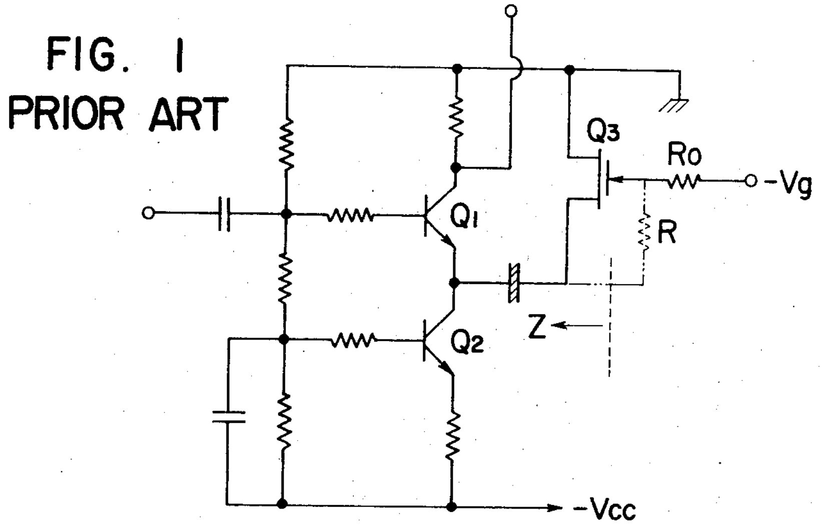
FIG. 1 PRIOR ART
FIG. 1 is a circuit diagram illustrating an example of a prior art circuit of the type described.

Prior to the description of an embodiment of the present invention, reference is made to an example of the conventional audio-frequency level control circuit by referring to FIG. 1.

Figure 3:
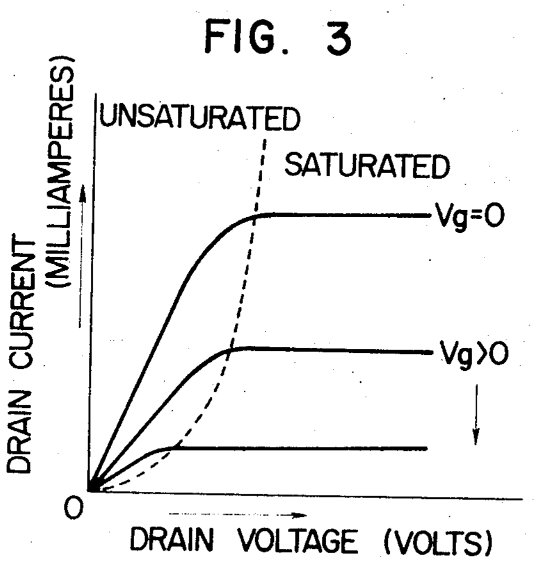
FIG. 3 is a characteristic illustration of a field effect transistor showing a drain current vs. drain voltage characteristics with respect to the applied gate voltages.

In FIG. 1, an emitter-grounded type amplifying transistor $Q_1$ is connected at its emitter electrode to a constant-current supply circuit which includes therein at least one transistor $Q_2$. An FET $Q_3$ is connected, from an AC viewpoint, to said constant-current supply circuit, and is so arranged that the inner source-drain impedance may be varied depending on the gate voltage $-Vg$ applied to the gate of the FET and thus the varying source-drain impedance permits the control of the rate of negative feedback for the emitter current of said amplifier transistor $Q_1$ so that the level of an output signal at its collector may be controlled at a desired value. In such type circuit, it should be understood that since the range of linearity in drain current vs. drain voltage characteristics of the FED $Q_3$ become narrower as its gate control voltage becomes higher i.e., $-Vg$ becomes more negative) as shown by a chain curve in FIG. 3, distortion is caused in the output signal of the transistor $Q_1$ when its input signal is at a low level, so that such an audio-frequency signal level control circuit is not applicable for practical use which needs high precision in level control of a low frequency signal, and particularly the use which needs a higher acoustic precision as in an electronic musical instrument. As a solution to this problem, there could be considered an insertion of a resistor R between the gate and drain electrodes of the FET $Q_3$ as shown in FIG. 1 to provide a negative feedback function of the FET operation to thereby increase the range of the linearity in the FET $Q_3$ as described above and to thus reduce the distortion of the output signal substantially independently of the applied gate voltage value ($-Vg$). However, this results in the fact that part of the gate control voltage $-Vg$ of the FET $Q_3$ is applied to the emitter of the amplifier transistor $Q_1$ and thus the rough variation of the voltage may leak to its collector in the form of an unwanted noise to the output signal. A great amount of such noises adversely affects the output signal to be detected at the collector of the amplifier $Q_1$ and this is noted especially when the audio-frequency signal level is low.

The condition can be analyzed as follows. Let us assume that the impedance on the emitter side of the transistor $Q_1$ as viewed from one end of said resistor R is Z, and that the gate control voltage $-Vg$ to be applied through a resistor $R_o$ to the gate of the FET $Q_3$ is V. The control voltage component $V_1$ appearing in the emitter of the transistor $Q_1$ can be expressed by:

$$V_1=\frac{Z}{R+R_0+Z}\cdot V \text{ (volts)}$$

wherein the input impedance of the FET $Q_3$ is assumed to be extremely larger than the values of the resistors R and $R_o$. Therefore, the voltage $V_1$ is of an unwanted component to the signal level control circuit of this type. That is to say, it makes an unavoidable noise at the collector of the transistor $Q_1$.

The present invention, therefore, has succeeded in the provision of an improved audio-frequency level control circuit which can completely overcome the conventional difficulties mentioned above.

Figure 2:
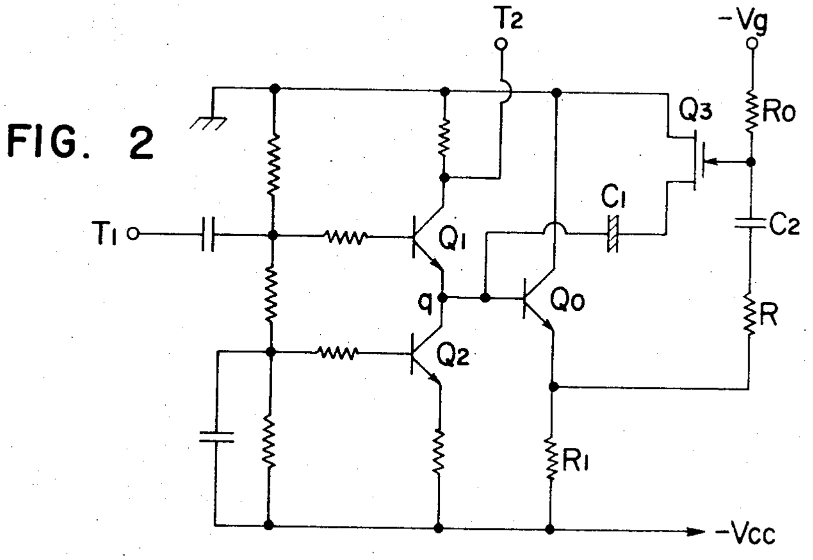
FIG. 2 is a circuit diagram showing an embodiment of an audio-frequency signal level control circuit according to the present invention.

Now, an embodiment of the present invention will be described by referring to FIG. 2, in which like references indicate like parts in contrast to FIG. 1.

The juncture g between the emitter of the transistor $Q_1$ and the collector of the transistor $Q_2$ — both of these transistors being connected in series with each other — is connected to the base of a collector-grounded (emitter follower) transistor $Q_o$, and is also connected through a DC blocking capacitor $C_1$ to the drain of the source-grounded FET $Q_3$. The gate of the FET $Q_3$ is connected through the resistor $R_o$ to a controlling variable voltage source $-Vg$ and at the same time connected through series-connected capacitor $C_2$ and resistor R to the emitter of the transistor $Q_o$, which emitter is connected through a resistor $R_1$ to a fixed power supply $-Vcc$.

$T_1$ and $T_2$ represent an input signal incoming terminal and an output signal outgoing terminal, respectively. However, the description concerning resistors for biasing the bases of the transistors $Q_1$ and $Q_2$, a load resistor and the other DC cutoff capacitors is omitted because of a conventional construction.

In operation, when an audio-frequency signal is applied to the input terminal $T_1$, it is amplified by the transistor $Q_1$ and derived at its collector, i.e., at the output terminal $T_2$, as an output signal. At such a time, as the gate voltage of the FET $Q_3$ approaches nearer the power supply $-V$cc side, the inner drain and source impedance of the FET $Q_3$ is made larger, so that the emitter of the amplifier transistor $Q_1$ becomes alsmost off the ground from an AC viewpoint. As a result, the transistor $Q_1$ is subjected to an extreme negative current feed back to thereby make the level of the output signal smaller. On on there hand, as the gate voltage of the FET $Q_3$ approaches nearer the ground side, the above-mentioned inner impedance becomes lower, so that the emitter of the transistor $Q_1$ approaches the ground side from an AC viewpoint, and then the quantity of the negative current feedback for the transistor $Q_1$ is extremely reduced to make the level of the output signal at its collector larger. Thus, the output signal level can be adjusted at a desired value by controlling the voltage applied to the gate of the FET $Q_3$.

In such cases as described above, the signal which is developed at the emitter of the amplifier transistor $Q_1$, that is to say, the signal produced at the collector of the transistor $Q_2$ or at the drain of the FET $Q_3$, is applied directly to the base of the emitter-follower transistor $Q_o$ and as a result, a signal having the same phase and substantially the same amplitude as those of said applied signal is detected at its emitter. The signal obtained at the emitter of the transistor $Q_o$ is applied through series-connected resistor R and capacitor $C_2$ to the gate of FET $Q_3$, and thus the FET $Q_3$ is subjected between its drain and gate to a predetermined quantity of negative current feedback, so that narrowness in the range of linearity in drain current vs. drain voltage characteristics due to the application of a large gate voltage $-V$g may be prevented, thus greatly improving the linearity of the output signal, i.e., extremely reducing the distortion of the output signal. At the same time, the noise component due to the variation of the above-mentioned gate voltage $-V$g is passed to ground through the resistor $R_1$ of a low resistance connected to the emitter of the emitter-follower transistor $Q_o$ performing unidirectional function, but not at all leaking on the base side of the transistor $Q_o$. Accordingly, no such noise component is derived at the emitter of the transistor $Q_1$ and thus incorporated into the output signal obtained at its collector, even when the output signal is considerably small in level.

The present level control circuit which has several excellent advantages as described above is quite suitable for use as a tone signal level control circuit for an electronic musical instrument or the like, specifically for use in an expression control circuit or in a percussive keyer circuit for the instrument.

Furthermore, if as illustrated by way of example an emitter-follower transistor circuit is employed as the unidirectional amplifier characterizing the present invention, the application of the transistor circuit to the conventional level control circuit can be easily accomplished without the need of base-biasing elements, so that great industrial merits are provided.

Although there has been described the arrangement of the present embodiment wherein the source and drain of the FET $Q_3$ are connected to the ground and to the emitter of the amplifier transistor $Q_1$, respectively, the drain and source of the FET $Q_3$ may be grounded and connected to the emitter of the transistor Q, respectively.

Furthermore, the emitter-follower transistor $Q_o$ as well as said transistors $Q_1$ and $Q_2$ may be substituted by other active elements such as an FET, a vacuum tube or the like, respectively.

While an embodiment of the present invention has been described only by way of example, it should be understood by those skilled in the art that other modifications and variations may be made also equally effectively without departing from the scope and spirit of the present invention, and that, therefore, the scope of the present invention is to be measured by the scope of the appended claims.

I claim:

1. An audio-frequency signal level control circuit comprising:

amplifier means including therein at least one first active element, said element having two electrodes connected respectively to audio-frequency signal input and output terminals and a third electrode, a constant-current supply circuit including a second active element connected with said first active element at said third electrode thereof, a voltage-controlled variable impedance FET element including a grounded source end and drain end connected to the juncture between said third electrode and said second active element and a voltage-controlled gage electrode for varying the quantity of negative feedback for the first active element of said amplifier means, a unidirectional amplifier circuit having its input side connected to said juncture between said third electrode and said second active element and a series connected resistor and capacitor coupling the output side of said unidirectional amplifier to said control electrode.

2. The level control circuit according to claim 1, in which said first and said second active elements are transistors.

3. The level control circuit according to claim 1, comprising: a variable DC voltage means connected through a resistor to the voltage-controlled electrode.

4. The level control circuit according to claim 1, in which said unidirectional amplifier circuit is constituted by an emitter-follower transistor amplifier circuit.

5. The level control circuit according to claim 4, in which a transistor constituting said emitter-follower circuit has a base connected to the said juncture between said first and second active elements, a collector grounded, and an emitter connected through a resistor of low resistance to a power source, said emitter being connected to said control electrode through the series-connected capacitor and resistor.

* * * * *